United States Patent
Park et al.

(10) Patent No.: US 8,698,122 B2
(45) Date of Patent: Apr. 15, 2014

(54) SILICON NANOWIRE COMPRISING HIGH DENSITY METAL NANOCLUSTERS AND METHOD OF PREPARING THE SAME

(71) Applicants: Gyeong-su Park, Suwon-si (KR); In-yong Song, Suwon-si (KR); Sung Heo, Suwon-si (KR); Dong-wook Kwak, Seongnam-si (KR); Hoon Young Cho, Seongnam-si (KR); Han-su Kim, Seoul (KR); Jae-man Choi, Hwaseong-si (KR); Moon-seok Kwon, Hwaseong-si (KR)

(72) Inventors: Gyeong-su Park, Suwon-si (KR); In-yong Song, Suwon-si (KR); Sung Heo, Suwon-si (KR); Dong-wook Kwak, Seongnam-si (KR); Hoon Young Cho, Seongnam-si (KR); Han-su Kim, Seoul (KR); Jae-man Choi, Hwaseong-si (KR); Moon-seok Kwon, Hwaseong-si (KR)

(73) Assignees: Samsung Electronics Co., Ltd. (KR); Dongguk University Industry-Academic Cooperation Foundation (KR)

( * ) Notice: Subject to any disclaimer, the term of this patent is extended or adjusted under 35 U.S.C. 154(b) by 0 days.

(21) Appl. No.: 13/644,147

(22) Filed: Oct. 3, 2012

(65) Prior Publication Data

US 2013/0026443 A1 Jan. 31, 2013

Related U.S. Application Data

(63) Continuation-in-part of application No. 13/076,957, filed on Mar. 31, 2011.

(30) Foreign Application Priority Data

Apr. 2, 2010 (KR) ........................ 10-2010-0030504

(51) Int. Cl.
*H01L 29/06* (2006.01)
(52) U.S. Cl.
USPC .................. 257/9; 257/E21.09; 257/E29.068; 977/762; 438/478
(58) Field of Classification Search
USPC ................. 257/9, E21.09, E29.068; 438/478; 977/762
See application file for complete search history.

(56) References Cited

U.S. PATENT DOCUMENTS

| | | | |
|---|---|---|---|
| 7,262,463 B2 | 8/2007 | Hoffman | |
| 7,335,259 B2 | 2/2008 | Hanrath et al. | |
| 8,030,108 B1* | 10/2011 | Lee et al. | 438/44 |
| 2008/0246020 A1* | 10/2008 | Kawashima et al. | 257/24 |
| 2009/0201496 A1 | 8/2009 | Lee et al. | |
| 2011/0042642 A1* | 2/2011 | Alet et al. | 257/9 |

FOREIGN PATENT DOCUMENTS

| | | |
|---|---|---|
| JP | 2004-269987 A | 9/2004 |
| KR | 1020040101858 A | 12/2004 |
| KR | 1020070048943 A | 5/2007 |
| KR | 1020070049035 A | 5/2007 |
| WO | 2008/081182 A1 | 7/2008 |
| WO | 2008/156892 A2 | 12/2008 |

OTHER PUBLICATIONS

European Search Report for Application No. 11160698.4-2203 dated Jul. 6, 2011.

(Continued)

*Primary Examiner* — Timor Karimy
(74) *Attorney, Agent, or Firm* — Cantor Colburn LLP

(57) ABSTRACT

A silicon nanowire including metal nanoclusters formed on a surface thereof at a high density. The metal nanocluster improves electrical and optical characteristics of the silicon nanowire, and thus can be usefully used in various electrical devices such as a lithium battery, a solar cell, a bio sensor, a memory device, or the like.

16 Claims, 11 Drawing Sheets

(56) References Cited

OTHER PUBLICATIONS

Dhalluin et al., "Critical condition for growth of silicon nanowires", Journal of Applied Physics, vol. 102, 2007, pp. 094906-1 to 094906-5.

Stelzner, et al., Silicon nanowire-based solar cells, Nanotechnology 19 (2008) 295203 (4pp).
Sivakov, et al., Silicon nanowire oxidation: the influence of sidewall structure and gold distribution, 2009 Nanotechnology 20 405607 (8pp) doi: 10.1088/0957-4484/20/40/405607.

* cited by examiner

US 8,698,122 B2

SILICON NANOWIRE COMPRISING HIGH DENSITY METAL NANOCLUSTERS AND METHOD OF PREPARING THE SAME

CROSS-REFERENCE TO RELATED APPLICATIONS

This application is a continuation-in-part of U.S. application Ser. No. 13/076,957, filed on Mar. 31, 2011, which claims the benefit of Korean Patent Application No. 10-2010-0030504, filed on Apr. 2, 2010, in the Korean Intellectual Property Office, the disclosures of which are incorporated herein in their entirety by reference.

BACKGROUND

1. Field

The present disclosure relates to a silicon nanowire including high density metal nanoclusters and a method of preparing the same, and more particularly, to a silicon nanowire structure including metal nanoclusters formed on a surface thereof at a high density.

2. Description of the Related Art 1-dimensional nano-structures, such as a silicon nanowire, have attracted much attention as next-generation nano materials, because a 1-dimensional nano-structure can be used in electronic devices, optical devices, bio sensors, etc., that are nano-sized and have excellent properties.

In particular, research has been conducted on a vertical-type silicon nanowire field effect transistor (FET) for increasing the integration density and speed of a semiconductor, and a silicon nanowire lithium battery for utilizing a high capacity property of silicon, and a solar cell.

SUMMARY

Provided is a silicon nanowire having an improved electrical conductivity and optical property.

Provided is a method of preparing the silicon nanowire.

Provided are various applications of the silicon nanowire.

Additional aspects will be set forth in part in the description which follows and, in part, will be apparent from the description, or may be learned by practice of the presented embodiments.

According to an aspect of the present invention, a silicon nanowire including metal nanoclusters formed on a surface of the silicon nanowire, wherein the silicon nanowire has a supersaturated structure.

The supersaturated structure may have a structure in which atoms of the metal nanoclusters are substituted for silicon atoms existing on the surface of the silicon nanowire.

The metal nanoclusters may exist inside a grid structure of the silicon nanowire.

The metal nanoclusters may uniformly exist in a lengthwise direction of the silicon nanowire.

The silicon nanowire may be grown by rapid thermal chemical vapor deposition (RTCVD) or laser thermal CVD (LTCVD).

The metal nanoclusters may have an average size within about 2 to about 5 nm.

The metal nanoclusters may exist at a density within about $1\times10^6/cm^2$ to about $1\times10^{16}/cm^2$.

The metal nanoclusters may include at least one metal selected from the group consisting of a transition metal, a lanthanide, a group 13 element (except boron), and a group 14 element (except carbon and silicon).

The metal nanocluster may include at least one metal selected from the group consisting of gold (Au), nickel (Ni), steel (Fe), silver (Ag), aluminum (Al), germanium (Ge), gadolinium (Gd), copper (Cu), indium (In), and lead (Pb).

The metal nanoclusters may include Au.

A cross-section of the silicon nanowire may have a hexagon structure.

An upper end portion of the silicon nanowire may include a metal gap having a hemispherical shape.

A length of the silicon nanowire may be within about 0.5 to about 20 μm.

The silicon nanowire may be obtained by rapid thermal chemical vapor deposition (CVD), laser thermal CVD (LTCVD), or metal organic CVD (MOCVD).

A length of the silicon nanowire may be within about 5 to about 12 μm.

According to another aspect of the present invention, a method of preparing a silicon nanowire, the method including: forming a metal thin film layer on a silicon substrate; forming a metal-silicon island by locally performing a first calcination process on the silicon substrate including the metal thin film layer in a CVD chamber under a hydrogen atmosphere; and growing the silicon nanowire including metal nanoclusters formed on a surface thereof, by locally performing a second calcination process on the silicon substrate including the metal-silicon island, while injecting a mixed gas into the CVD chamber. The first calcination process may be performed at a temperature within about 300 to about 1,000□ and at a pressure within about 0.1 to about 500 Torr.

The second calcination process may be performed at a temperature within about 500 to about 600□ at a pressure within about 0.1 to about 10 Torr.

According to another aspect of the present invention, an electric device including a silicon nanowire.

The electric device may include a solar cell, lithium battery, transistor, memory device, optical sensor, bio sensor, light-emitting diode, wave guide, light-emitting device, or capacitor.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
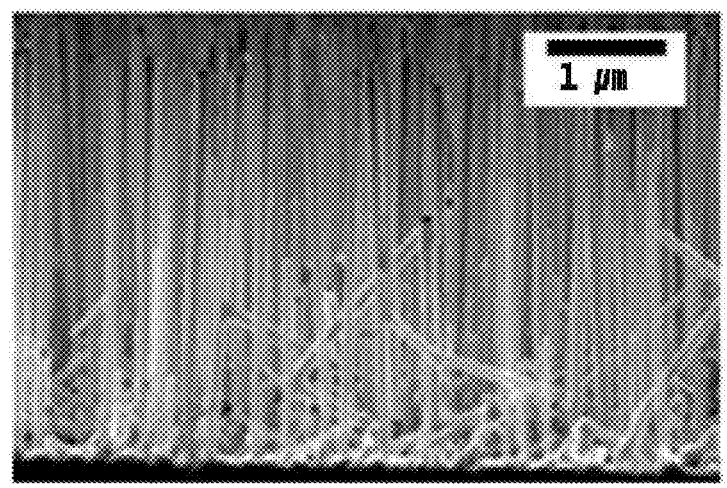
FIG. 1 shows a scanning electron microscope (SEM) image of a silicon nanowire obtained in Example 1 and including gold (Au) nanoclusters formed on a surface thereof at a high density, according to an embodiment of the present invention.

The present invention will now be described more fully with reference to the accompanying drawings, in which exemplary embodiments of the invention are shown.

The present invention provides a silicon nanowire including metal nanoclusters, wherein the silicon nanowire has a hetero-structure comprising at least two different materials. The silicon nanowire including the metal nanoclusters has a structure in the metal nanoclusters are formed, for example, a structure in which the metal nanoclusters are uniformly formed on a surface of the silicon nanowire.

As such, various properties of the silicon nanowire, for example, a charge capacity characteristic, a charge capture characteristic, an electrical conductivity, an optical characteristic, etc., may be improved because of the metal nanoclusters existing on the silicon nanowire at a high density.

The metal nanoclusters having an electrical conductivity higher than an electrical conductivity of the silicon nanowire exist on the surface of the silicon nanowire at a high density, and thus the electrical conductivity of the silicon nanowire may be improved. Furthermore, since the metal nanoclusters exist on the surface of the silicon nanowire at a high density, and thus an optical characteristic necessary for having an excellent response signal time may be provided by a surface plasmon resonance of the metal nanoclusters.

The metal nanoclusters providing such characteristics may include at least one metal selected from the group consisting of a transition metal, a lanthanide, a group 13 element (except for boron), and a group 14 element (except for carbon and silicon). For example, the metal nanoclusters may include at least one metal selected from the group consisting of gold (Au), nickel (Ni), steel (Fe), silver (Ag), aluminum (Al), germanium (Ge), gadolinium (Gd), copper (Cu), indium (In), and lead (Pb), but the present invention is not limited thereto. Among these metals, a nontoxic metal may be used as a medicine transfer material or used in bio applications, according to the purpose. For example, the nontoxic metal may be Au or Ag.

The metal nanoclusters may include a metal agglomerated in the form of a nanodot. The metal nanoclusters may have a circular shape or an irregular shape. The metal nanoclusters may have a size less than a diameter of the silicon nanowire, for example, a size less than about 500 nm, which is characteristic of a nanowire. For example, the metal nanoclusters may have an average size within about 1 to about 100 nm, within about 1 to about 10 nm, or within about 2 to about 5 nm. When the metal nanoclusters have a circular shape, the size of the metal nanoclusters may be defined as a diameter of the metal nanoclusters. On the other hand, when the metal nanoclusters have an irregular shape, the size of the metal nanoclusters may be defined as a length of a major axis of the metal nanoclusters.

The metal nanoclusters exist on the surface of the silicon nanowire at a high density, for example, exist at a density within about $1\times10^6/cm^2$ to about $1\times10^{16}/cm^2$ or within about $1\times10^{11}/cm^2$ to about $1\times10^{13}/cm^2$. As such, the metal nanoclusters existing at such a high density may be uniformly arranged, and the metal nanoclusters may be arranged at an interval within about 1 to about 100 nm.

The range of distribution, interval of arrangement, and size of the metal nanoclusters may vary according to conditions of a manufacturing process, and may be appropriately adjusted according to the purpose.

Figure 10A:
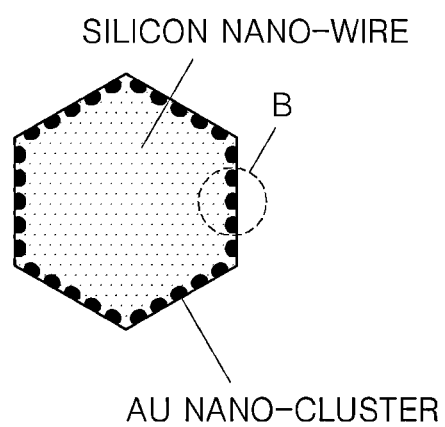
FIG. 10A is a schematic view showing a structure of a cross-section of silicon nanowire including metal nanoclusters according to an embodiment of the present invention.
Figure 10B:
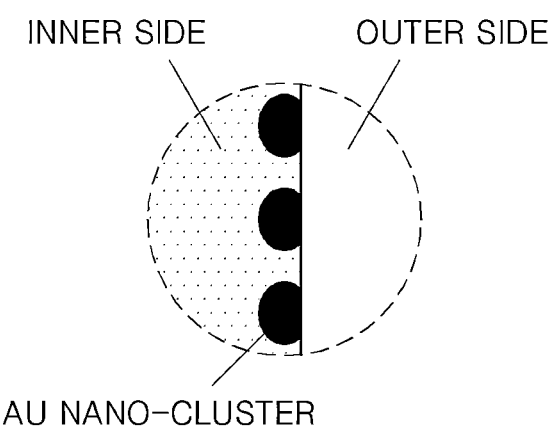
FIG. 10B is an enlarged view of a region 'B' shown in FIG. 10A.

According to an embodiment of the present invention, the metal nanoclusters may exist mainly on a surface of the silicon nanowire or inside the silicon nanowire. FIG. 10A is a schematic view showing a structure of a cross-section of silicon nanowire including metal nanoclusters according to an embodiment of the present invention. As shown in FIG. 10A, the metal nanoclusters exist mainly on the surface of the silicon nanowire. For example, the metal nanoclusters exist in an internal region of the surface of the silicon nanowire. FIG. 10B is an enlarged view of a region 'B' shown in FIG. 10A. As shown in FIG. 10B, the metal nanoclusters according to an embodiment of the present invention exist on the surface of the silicon nanowire, and in particular, in the internal region of the surface of the silicon nanowire.

In order for the metal nanoclusters to have a structure shown in FIG. 10A, the metal nanoclusters need to penetrate a grid structure of the silicon nanowire. For this, silicon atoms on the surface of the silicon nanowire may be replaced with atoms of the metal nanoclusters. Such a structure in which the silicon nanowire is replaced with the atoms of the metal nanoclusters may be formed by controlling a process of growing the silicon nanowire.

The process of growing silicon nanowire may use RTCVD or LTCVD. In these methods, a reaction base material is locally heated, thereby least affecting an ambient environment.

As described above, the metal nanoclusters according to an embodiment of the present invention may uniformly exist across the silicon nanowire. For example, the silicon nanowire including the metal nanoclusters may have a length in a range between about 0.5 to about 20 μm, between about 1 to about 15 μm, between about 3 to about 12 μm, or between about 5 to about 12 μm. The metal nanoclusters may uniformly exist in a lengthwise direction of the silicon nanowire.

If the silicon nanowire including the metal nanoclusters is to be formed of a silicon material, for example, amorphous silicon, crystalline silicon, or silicon comprising silica, any silicon material may be used regardless of its shape and size. The silicon nanowire including the metal nanoclusters according to an embodiment of the present invention may have a hexagon-shaped cross-section, and an upper end portion of the silicon nanowire may include a metal cap having a hemispherical shape.

The silicon nanowire having a diameter, for example, within about 10 to about 500 nm and a length within about 0.5 to about 20 μm may be used. The diameter of the silicon nanowire may be measured via a cross-section that is cut perpendicularly with respect to the length of the silicon nanowire. For example, if the silicon nanowire has a hexagon-shaped cross-section, the cross-section may be measured as a length of a major axis (a line connecting corresponding vertices). The diameter and length of the silicon nanowire may be adjusted according to conditions of a manufacturing process.

The silicon nanowire including the metal nanoclusters formed on the surface thereof may be prepared by forming a metal thin film layer on a silicon substrate under a hydrogen atmosphere and then growing the silicon nanowire.

According to an embodiment of the present invention, the silicon nanowire may be prepared by forming a metal thin film layer on a silicon substrate, forming a metal-silicon island by performing a first calcination process on the silicon substrate including the metal thin film layer in a chemical vapor deposition (CVD) chamber under a hydrogen atmosphere, and then growing the silicon nanowire by performing a second calcination process on the silicon substrate including the metal-silicon island while injecting a mixed gas into the CVD chamber.

The metal thin film layer formed on the silicon substrate may be a metal thin film layer formed of a metal for forming the metal nanoclusters. The metal thin film layer may include at least one metal selected from the group consisting of a transition metal, a lanthanide, a group 13 element (except for boron), and a group 14 element (except for carbon and silicon). For example, the metal for forming the metal nanoclusters may include at least one metal selected from the group consisting of Au, Ni, Fe, Ag, Al, Ge, Gd, Cu, In, and Pb, but the present invention is not limited thereto.

The metal thin film layer may be formed to have a thickness within about 1 to about 100 nm, for example, within about 1 to about 10 nm, by sputtering, CVD, spin coating, atomic layer deposition (ALD), or metal organic chemical vapor deposition (MOCVD). The metal thin film layer may be formed on at least one surface of the silicon substrate or may be formed on opposite surfaces of the silicon substrate.

The metal thin film layer is formed on the silicon substrate, and then the silicon nanowire is grown. The silicon nanowire may be grown by, for example, RTCVD, LTCVD, or MOCVD.

As described above, when RTCVD or LTCVD is used to grow the silicon nanowire, the substrate in which the silicon nanowire is formed may be locally heated to minimize influence of impurity substances existing inside the CVD chamber. Also, by rapidly increasing a temperature of the substrate, other conditions that may affect formation of the silicon nanowire may be excluded.

When such a process of growing the silicon nanowire is used, the metal nanoclusters penetrate the grid structure of the silicon nanowire during the growth of the silicon nanowire. Also, such penetration may occure across the growth of the silicon nanowire, and thus the metal nanoclusters uniformly exist from the upper end portion to an lower end of the silicon nanowire.

Figure 11A:
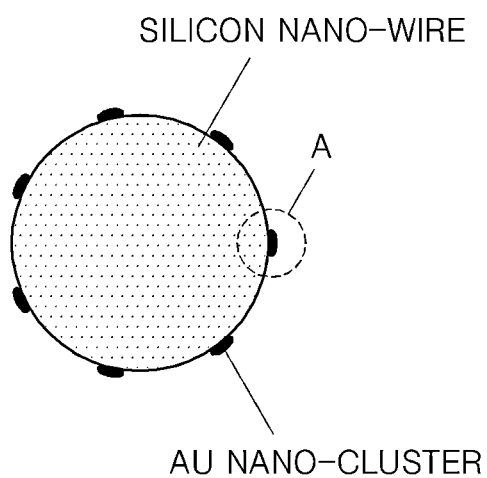
FIG. 11A is a schematic view showing a structure of a cross-section of silicon nanowire including metal nanoclusters according to a prior art.
Figure 11B:
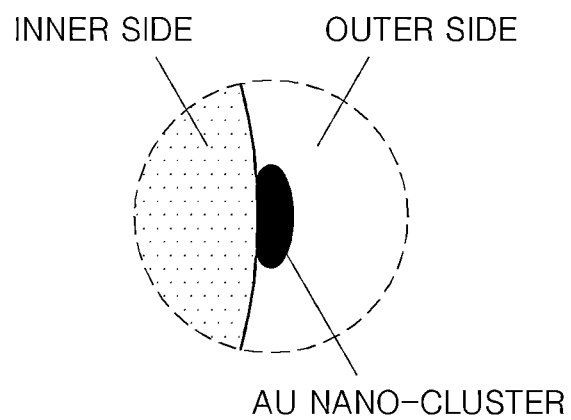
FIG. 11B is an enlarged view of a region 'A' shown in FIG. 11A.

Unlike this, in a conventional process of growing a silicon nanowire, a chamber in which reaction occurs is wholly heated during growth of the silicon nanowire, and thus the process may be influenced by impurity substances existing inside the chamber. Accordingly, the metal nanoclusters formed during the process of growing the silicon nanowire are formed outside the silicon nanowire but not inside the surface of the silicon nanowire. A structure of the silicon nanowire formed through the above-described process is schematically shown in FIG. 11A. As shown in FIG. 11A, in a silicon nanowire according to a prior art, metal nanoclusters may not penetrate a silicon grid structure, and are formed on a surface of the silicon grid structure. FIG. 11B is an enlarged view of a region 'A' shown in FIG. 11A. As shown in FIG. 11B, the metal nanoclusters are formed on an external surface of the silicon nanowire.

Also, in such a conventional process of growing the silicon nanowire, the metal nanoclusters do not uniformly exist in a lengthwise direction of the silicon nanowire, and are formed mainly at an initial stage of the process. Accordingly, the metal nanoclusters exist at a high density in the upper end portion of the silicon nanowire and exist at a low density in the lower end portion of the silicon nanowire.

According to an embodiment of the present invention, in order to grow the silicon nanowire, the silicon substrate including the metal thin film layer may be positioned inside the CVD chamber by using the above-described method. The CVD chamber may be a CVD chamber using a halogen lamp or laser.

When the first calcination process is performed in the CVD chamber, the metal and the silicon substrate react with each other, and thus the metal-silicon island is uniformly formed on the substrate. The metal-silicon island, which is nano-sized, is a particulate material having a silicide shape.

The first calcination process may be performed under a hydrogen atmosphere, and may be performed under a vacuum atmosphere, for example, a pressure within about 0.1 to about 500 Torr. The first calcination process may be performed at a temperature within about 300 to about 1,000□ for about 5 minutes to about one hour.

After the metal-silicon island is uniformly formed on the silicon substrate by the first calcination process, the second calcination process is performed to grow the silicon nanowire including the metal nanoclusters.

The second calcination process may be performed when the CVD chamber is maintained at a pressure within about 0.1 to about 10 torr and at a temperature within about 500 to about 600□, while injecting a mixed gas into the CVD chamber, for about 0.1 to about 10 hours. The mixed gas may be a mixture of SiH$_4$ and H$_2$. The amount of SiH$_4$ may be within about 1 to about 10 sccm, and the amount of H$_2$ may be within about 10 to about 100 sccm.

After the second calcination process is performed, the silicon nanowire including the metal nanoclusters uniformly formed on the surface of the silicon nanowire, for example, inside the surface thereof, at a high density may be obtained.

The size, degree of distribution, interval of arrangement of the metal nanoclusters or the diameter, length, etc. of the silicon nanowire may be controlled by adjusting the pressure, temperature, stay time, etc. of the CVD chamber during the first and second calcination processes. For example, the silicon nanowire including Au nanoclusters may be controlled by adjusting the pressure, temperature, stay time, etc. of the CVD chamber.

After the silicon nanowire including the metal nanoclusters formed on the surface thereof is prepared, a thermal treatment may be additionally performed on the silicon nanowire at a temperature within about 300 to about 1,000□ for 0.1 to 10 hours so as to adjust the size or density of the metal nanoclusters.

The silicon nanowire including the metal nanoclusters formed on the surface thereof at a high density may have an improved electron capture characteristic, improved electrical conductivity, and an improved optical characteristic (light absorption or optical emitting), and thus the silicon nanowire may be used in various electric devices.

The electric devices may include a solar cell, a field effect transistor (FET), a charge trap flash (CTF) memory, an optical sensor, a bio sensor, a light-emitting diode, a surface plasmon wave guide, a photoluminescence (PL) device, a capacitor, or the like.

When the silicon nanowire including the metal nanoclusters is used in a bio field, the metal nanoclusters, which are appropriate for transferring bio materials or for a bio sensor, are distributed on the surface of the silicon nanowire at a high density, and thus the silicon nanowire including the metal nanoclusters may be used as a nano material having less toxicity compared to a conventional silicon nanowire for use in the bio field.

Furthermore, when the silicon nanowire including the metal nanoclusters is used for a lithium battery, the silicon nanowire has an excellent conductivity and has a structure in which deterioration of silicon due to charge/discharge may be reduced compared to that of a lithium battery including a conventional silicon nanowire, and thus a silicon nanowire lithium battery having improved characteristics may be manufactured.

In addition, an optical device having an excellent response signal time may be manufactured due to a surface plasmon resonance of the high density metal nanoclusters, which are supersaturated on the surface of the silicon nanowire. A charge trap characteristic of the metal nanoclusters may be applied to a device through a simple process to allow the device to have an excellent charge trap characteristic, compared to a CTF flash memory manufactured through a conventional thin film manufacturing process.

Hereinafter, the present invention may be described with reference to following Examples, but the following Examples are intended to describe, but not limit, the invention.

EXAMPLE 1

A gold (Au) thin film layer having a thickness within 1.0 to 1.5 nm was deposited by sputtering on a silicon (100) substrate having a size of 1.0×1.0 cm$^2$ and a thickness of 700 μm.

The silicon substrate on which the Au thin film layer is formed was moved to a RTCVD chamber including a halogen lamp, and then a calcination process was performed within the chamber under a hydrogen atmosphere at a pressure of 0.5 Torr and a temperature of 700□ for 10 minutes so as to form an Au-silicon island having a nano size within 50 to 150 nm.

After the Au-silicon island was formed, a mixed gas of SiH$_4$ (2 sccm) and H$_2$ (50 sccm) was injected into the chamber while maintaining the pressure and temperature of the chamber at 0.5 Torr and 550□, respectively, so as to grow a silicon nanowire, thereby preparing the silicon nanowire including Au nanoclusters formed on a surface thereof.

FIG. 1 is a scanning electron microscope (SEM) image of the silicon nanowire including the Au nanoclusters formed on the surface thereof, obtained by the above method. As illustrated in FIG. 1, the silicon nanowire having a diameter within about 30 to about 100 nm and a length within about 0.5 to about 12 μm was prepared at a high density.

Figure 2A:
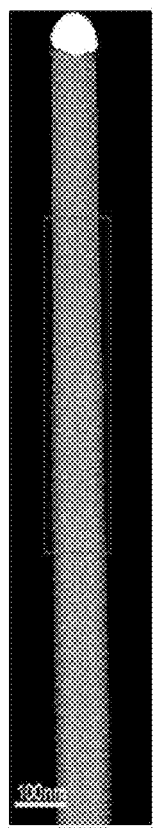
FIG. 2A shows an enlarged image of the silicon nanowire obtained in Example 1 and including the Au nanoclusters formed on the surface thereof at a high density.

FIG. 2A is a Z-contrast image of one silicon nanowire including the Au nanoclusters formed on the surface of the silicon nanowire at a high density. The silicon nanowire has a uniform thickness. Also, it is seen that the Au nanoclusters are uniformly formed at a high density in a lengthwise direction of the silicon nanowire from an upper end portion to a lower end portion of the silicon nanowire.

Figure 2B:
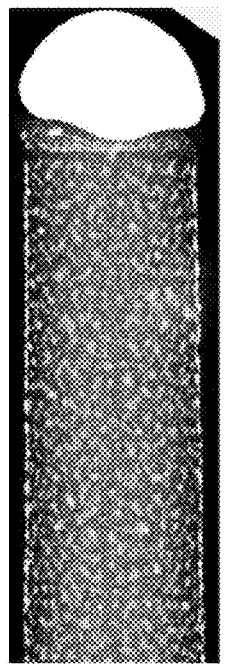
FIG. 2B is a partial enlarged image of an upper part of the silicon nanowire obtained in Example 1 and including the Au nanoclusters formed on the surface thereof at a high density.

FIG. 2B a partial enlarged image of an upper part of the silicon nanowire of FIG. 2A including the Au nanoclusters formed at a high density on the surface thereof. The Au nanoclusters each having a size within about 2 to about 5 nm are uniformly distributed on the entire surface of the silicon nanowire, and a hemispherical cap formed of Au is formed on the upper part of the silicon nanowire.

Figure 2C:
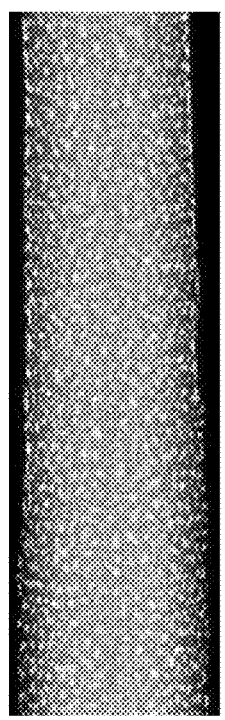
FIG. 2C is a partial enlarged image of a central part of the silicon nanowire obtained in Example 1 and including the Au nanoclusters formed on the surface thereof at a high density.

FIG. 2C is a partial enlarged image of a central part of the silicon nanowire, and the Au nanoclusters each having a size within about 2 to about 5 nm are uniformly distributed on the entire surface of the silicon nanowire.

Figure 3A:
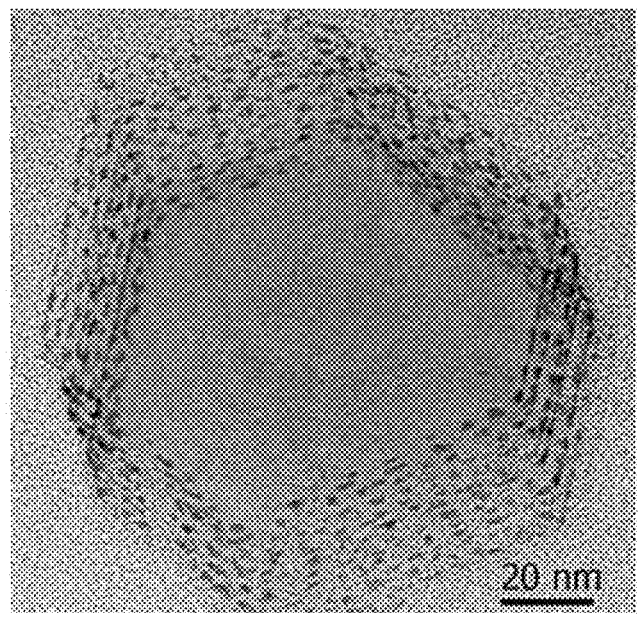
FIG. 3A shows a transmission electron microscopy (TEM) image of a cross-section of the silicon nanowire obtained in Example 1 and including the Au nanoclusters formed on the surface thereof at a high density.
Figure 3B:
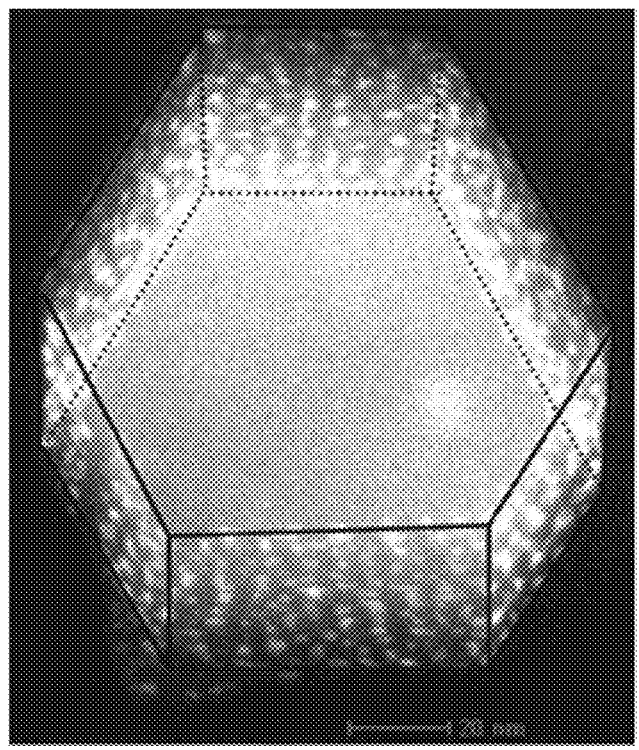
FIG. 3B shows a Z-contrast (STEM) image of a cross-section of the silicon nanowire obtained in Example 1 and including the Au nanoclusters formed on the surface thereof at a high density.

FIG. 3A is a transmission electron microscopy (TEM) image of a cross-section of the silicon nanowire of Example 1 including the Au nanoclusters formed on the surface thereof. FIG. 3B is a Z-contrast image showing a hexagon-shaped cross-section of the silicon nanowire. In FIG. 3A, Au nanoclusters shown as black spots exist inside the surface of the silicon nanowire but not outside the surface of the silicon nanowire, and the Au nanoclusters are uniformly distributed at a predetermined interval. This may be further apparent from Au nanoclusters shown as white spots in FIG. 3B.

As a result of checking a density of the Au nanoclusters by using a three-dimensional (3D) tomography technique, the Au nanoclusters having a density of about 3.2×10$^{12}$/cm$^2$ exist on the surface of the silicon nanowire.

Figure 4A:
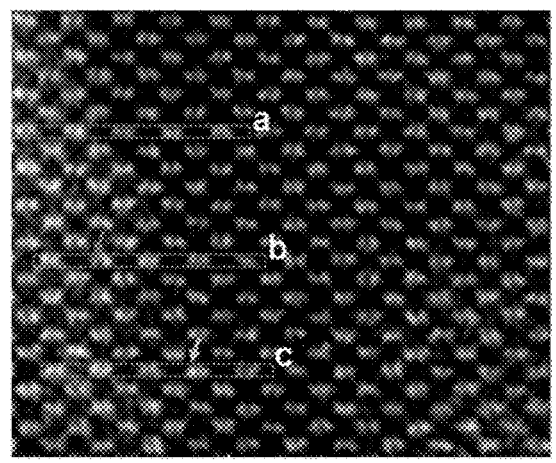
FIG. 4A shows a high-resolution Z-contrast image of the Au nanoclusters included in the silicon nanowire obtained in Example 1.
Figure 4B:
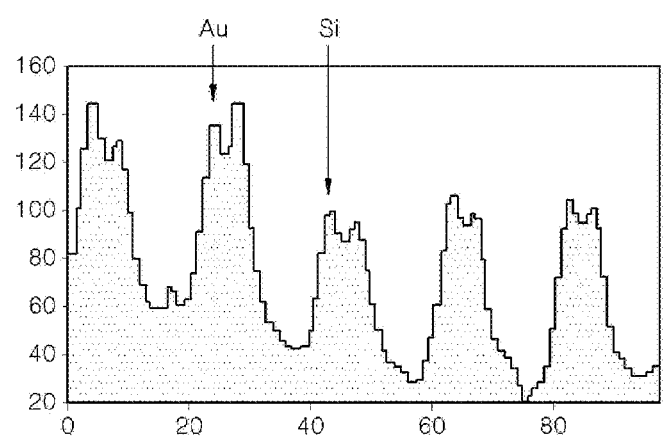
FIGS. 4B, 4C and 4D are graphs showing Si and Au atoms distinguished by differences of contrast intensities of a, b and c regions of FIG. 4A.
Figure 4C:
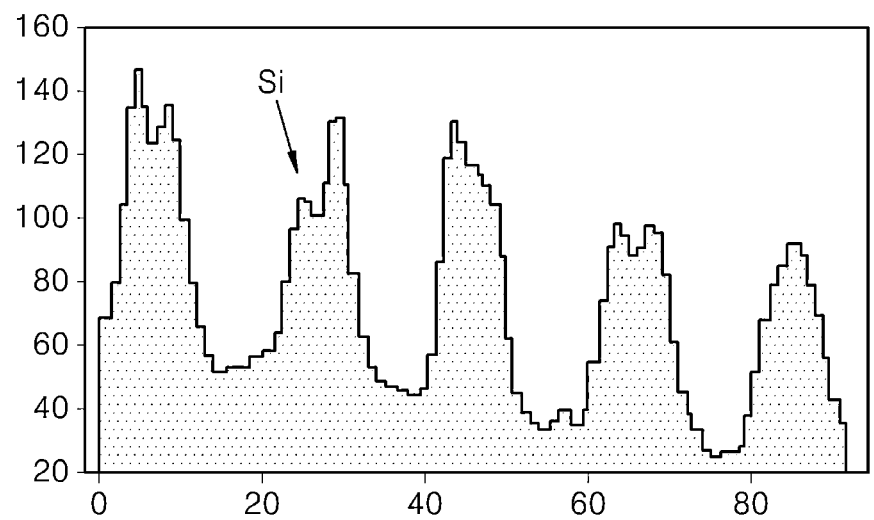
Figure 4D:
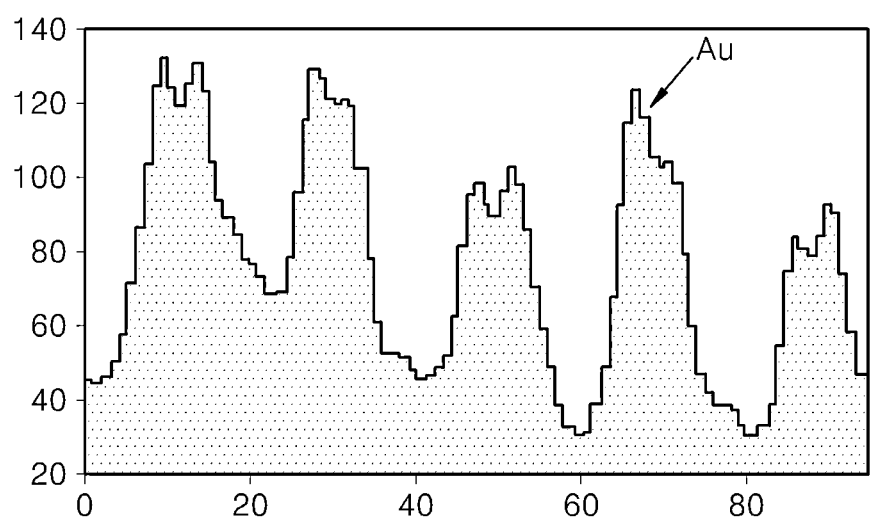

FIG. 4A is a high-resolution Z-contrast image showing a distribution of the Au nanoclusters on the surface of the silicon nanowire obtained in Example 1. FIGS. 4B through 4D show distributions of contrast intensities of a, b, and c regions of FIG. 4A. The graphs of FIGS. 4B through 4D show that Au exists in a high intensity position, and silicon atoms exist in a low intensity position. Accordingly, FIG. 4A shows a supersaturated structure in which Au atoms are substituted for silicon existing on the surface of the silicon nanowire.

Figure 5:
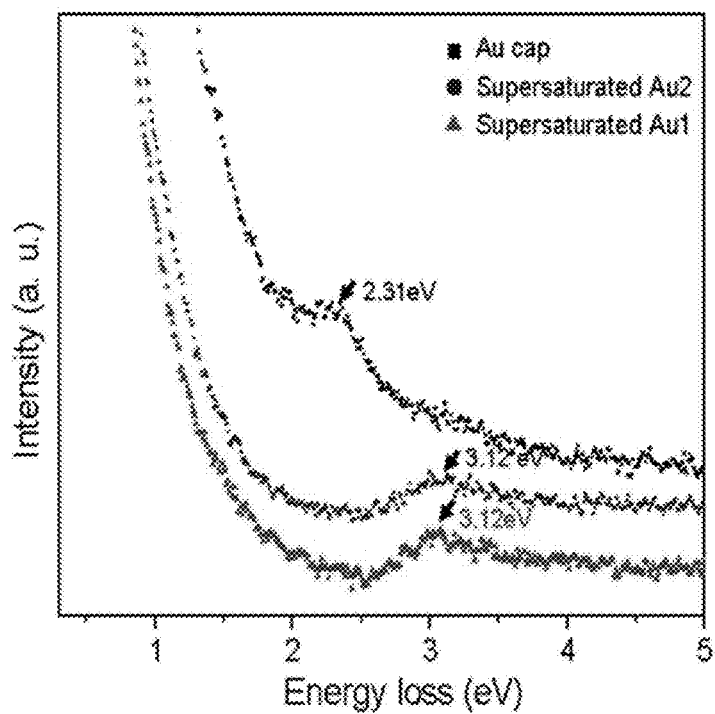
FIG. 5 is a graph showing Monochrome-EELS data obtained by measuring and comparing surface plasmon excitation energies of an Au cap and an Au nanocluster that exist in the silicon nanowire obtained Example 1.

FIG. 5 is a graph showing a result obtained by measuring an optical characteristic of an Au cap existing on the upper end portion of the silicon nanowire obtained in Example 1 and an optical characteristic of the Au nanoclusters existing on the surface of the silicon nanowire. A surface plasmon resonance occurred at about 2.31 eV (537 nm) in the Au cap and occurred at about 3.12 eV (397 nm) in the Au nanoclusters.

Figure 6:
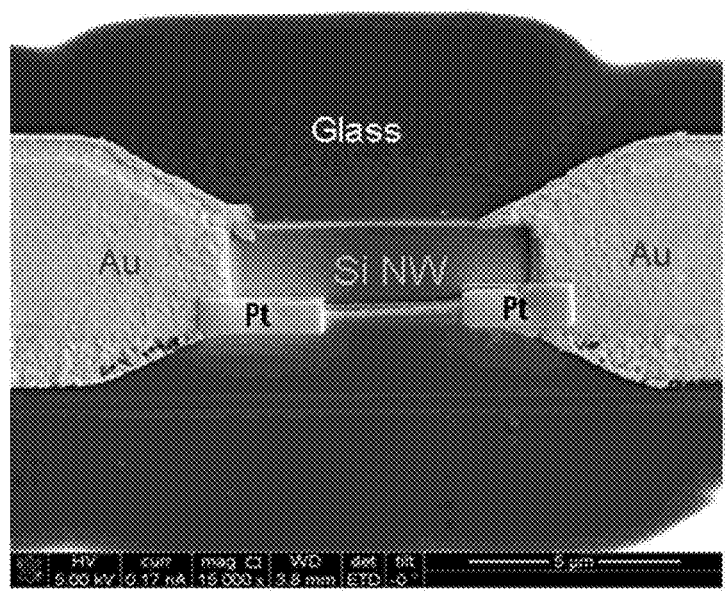
FIG. 6 is a SEM image of a nano-optical device manufactured using the silicon nanowire obtained in Example 1 and including the Au nanoclusters formed on the surface thereof at a high density.

FIG. 6 is a SEM image of a nano-optical device manufactured using a principle in which resistance is decreased by a surface plasmon resonance effect of the Au nanoclusters, when light having a wavelength of about 397 nm is radiated onto the silicon nanowire of Example 1 including the Au nanoclusters. The nano-optical device is manufactured by forming two Au electrodes having a size of several tens of micrometers on a glass substrate, connecting the silicon nanowire of Example 1 including the Au nanoclusters in a bridge shape, and then covering the silicon nanowires, which exist in both the Au electrodes, with platinum (Pt).

Figure 7A:
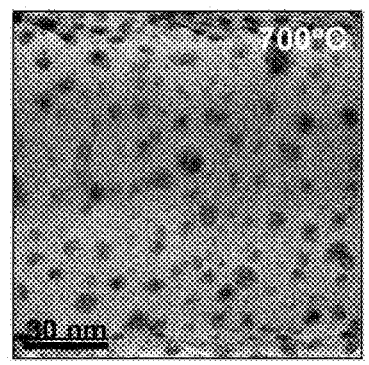
FIG. 7A is an enlarged image of a surface of the silicon nanowire obtained by performing a thermal treatment thereon at a temperature of 700□, wherein the silicon nanowire obtained in Example 1 includes the Au nanoclusters formed on the surface thereof at a high density.
Figure 7B:
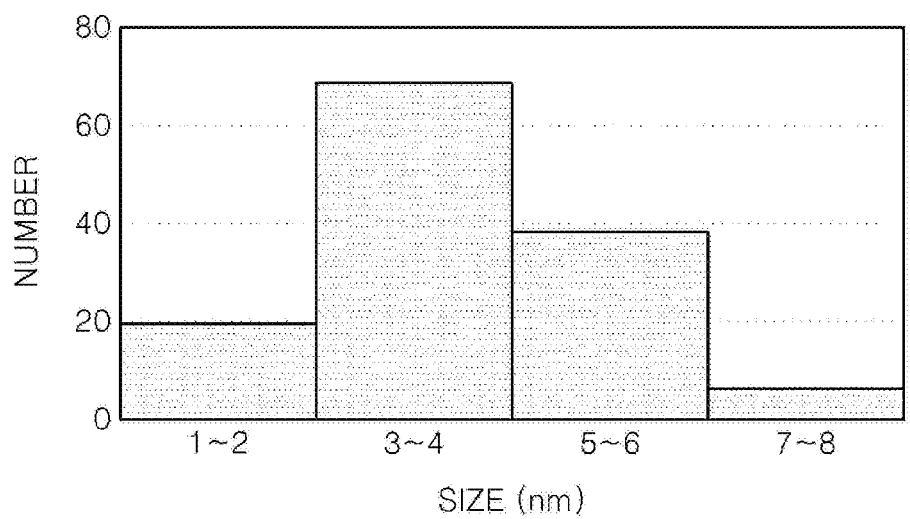
FIG. 7B is a graph showing a distribution of the Au nanoclusters according to its size.
Figure 8A:
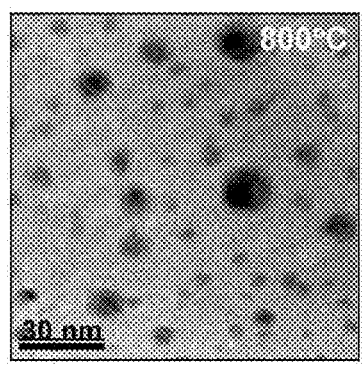
FIG. 8A is an enlarged image of a surface of the silicon nanowire obtained by performing a thermal treatment thereon at a temperature of 700□, wherein the silicon nanowire obtained in Example 1 includes the Au nanoclusters formed on the surface thereof at a high density.
Figure 8B:
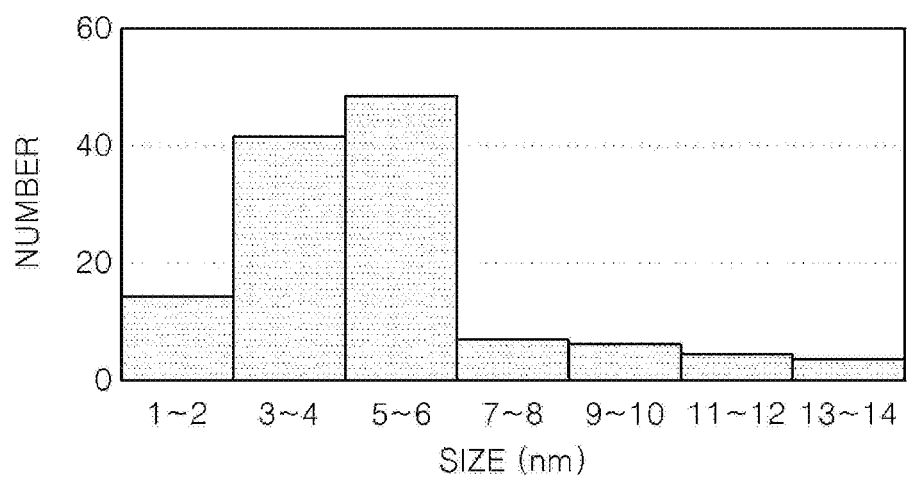
FIG. 8B is a graph showing a distribution of the Au nanoclusters according to its size.
Figure 9A:
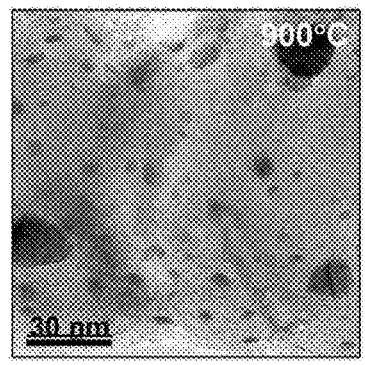
FIG. 9A is an enlarged image of a surface of the silicon nanowire obtained by performing a thermal treatment thereon at a temperature of 700□, wherein the silicon nanowire obtained in Example 1 includes the Au nanoclusters formed on the surface thereof at a high density.
Figure 9B:
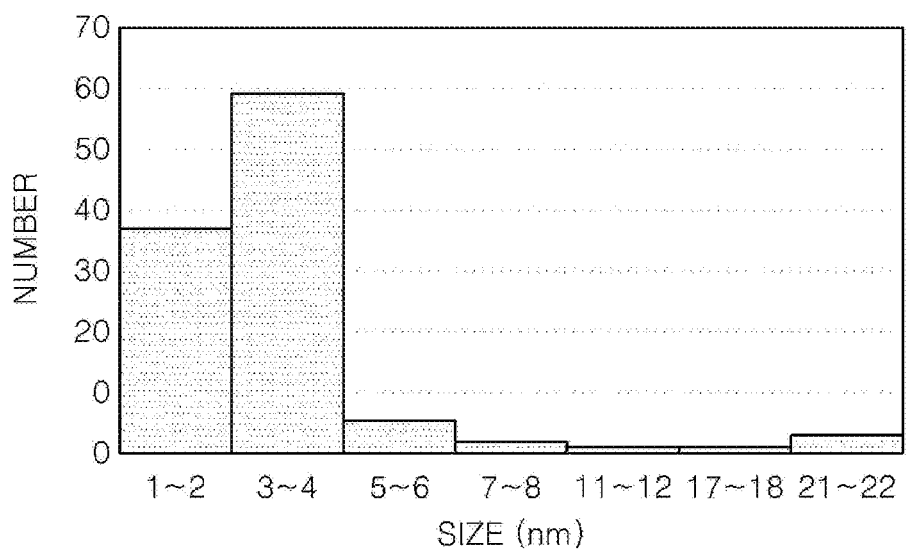
FIG. 9B is a graph showing a distribution of the Au nanoclusters according to its size.

FIGS. 7A, 8A and 9A are partial enlarged images of the Au nanoclusters obtained by respectively performing thermal treatments on silicon nanowires of Example 1 under a nitrogen atmosphere at temperatures of 700□, 800□ and 900□, and FIGS. 7B, 8B and 9B are graphs showing distributions according to the size of the Au nanoclusters. The size of the Au nanoclusters may vary from about 1 to about 30 nm according to a temperature of the thermal treatment.

A silicon nanowire including metal nanoclusters according to embodiments of the present invention has improved electrical conductivity and optical characteristics, and thus the silicon nanowire can be used in various semiconductor devices using a silicon nanowire.

Also, when Au or Ag having less toxicity is used as the metal nanoclusters, the metal nanoclusters can be used as a nano material appropriate for transfer of a bio material or for a bio sensor.

When the silicon nanowire including the metal nanoclusters is used in a lithium battery, the silicon nanowire has an excellent conductivity and has a structure in which deterioration of silicon due to charge/discharge may be reduced, and thus a lithium battery having an improved electrical characteristic can be manufactured.

Furthermore, the silicon nanowire including the metal nanoclusters can be used to manufacture an optical device, for example, a solar cell, having an excellent response signal time by using a surface plasmon resonance.

A charge trap characteristic of the metal nanocluster included in the silicon nanowire is excellent, and the silicon nanowire prepared by a method according to the present invention is simple, compared to a CTF flash memory manufactured by a conventional thin film manufacturing process.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A silicon nanowire comprising metal nanoclusters formed on an inner region of an outer circumferential surface of the silicon nanowire, wherein the silicon nanowire has a supersaturated structure, and the supersaturated structure has a structure in which atoms of the metal nanoclusters are substituted for silicon atoms existing on an outer surface of the silicon nanowire.

2. The silicon nanowire of claim 1, wherein the metal nanoclusters exist inside a grid structure of the silicon nanowire.

3. The silicon nanowire of claim 1, wherein the metal nanoclusters uniformly exist in a lengthwise direction on the outer circumferential surface of the silicon nanowire.

4. The silicon nanowire of claim 1, wherein the silicon nanowire is grown by rapid thermal chemical vapor deposition (RTCVD) or laser thermal CVD (LTCVD).

5. The silicon nanowire of claim 1, wherein the metal nanoclusters have an average size within about 2 to about 5 nm.

6. The silicon nanowire of claim 1, wherein the metal nanoclusters exist at a density within about $1 \times 10^6/cm^2$ to about $1 \times 10^{16}/cm^2$.

7. The silicon nanowire of claim 1, wherein the metal nanoclusters comprise at least one metal selected from the group consisting of a transition metal, a lanthanide, a group 13 element (except boron), and a group 14 element (except carbon and silicon).

8. The silicon nanowire of claim 1, wherein the metal nanocluster comprises at least one metal selected from the group consisting of gold (Au), nickel (Ni), steel (Fe), silver (Ag), aluminum (Al), germanium (Ge), gadolinium (Gd), copper (Cu), indium (In), and lead (Pb).

9. The silicon nanowire of claim 1, wherein the metal nanoclusters comprises Au.

10. The silicon nanowire of claim 1, wherein a cross-section of the silicon nanowire has a hexagon structure.

11. The silicon nanowire of claim 1, wherein an upper end portion of the silicon nanowire comprises a metal cap having a hemispherical shape.

12. The silicon nanowire of claim 1, wherein a length of the silicon nanowire is within about 0.5 to about 20 μm.

13. The silicon nanowire of claim 1 is obtained by rapid thermal chemical vapor deposition (CVD), laser thermal CVD (LTCVD), or metal organic CVD (MOCVD).

14. The silicon nanowire of claim 1, wherein a length of the silicon nanowire is within about 5 to about 12 μm.

15. An electric device comprising a silicon nanowire of claim 1.

16. The electric device of claim 15, wherein the electric device comprises a solar cell, lithium battery, transistor, memory device, optical sensor, bio sensor, light-emitting diode, wave guide, light-emitting device, or capacitor.

* * * * *